(12) United States Patent
Shao et al.

(10) Patent No.: US 9,621,077 B2
(45) Date of Patent: Apr. 11, 2017

(54) METHOD FOR MANUFACTURING ENERGY HARVESTER COMPRISING PIEZOELECTRIC POLYMER MICROSTRUCTURE ARRAY

(71) Applicant: XI'AN JIAOTONG UNIVERSITY, Xi'an (CN)

(72) Inventors: Jinyou Shao, Xi'an (CN); Yucheng Ding, Xi'an (CN); Xiaoliang Chen, Xi'an (CN); Yaopei Zhou, Xi'an (CN); Hongmiao Tian, Xi'an (CN); Xiangming Li, Xi'an (CN)

(73) Assignee: XI'AN JIAOTONG UNVERSTIY, Xi'an (CN)

( * ) Notice: Subject to any disclaimer, the term of this patent is extended or adjusted under 35 U.S.C. 154(b) by 274 days.

(21) Appl. No.: 14/633,131

(22) Filed: Feb. 26, 2015

(65) Prior Publication Data
US 2015/0236620 A1 Aug. 20, 2015

Related U.S. Application Data

(63) Continuation-in-part of application No. PCT/CN2014/079030, filed on May 31, 2014.

(30) Foreign Application Priority Data

Jan. 21, 2014 (CN) .......................... 2014 1 0027619

(51) Int. Cl.
*H01L 41/22* (2013.01)
*H04R 17/00* (2006.01)
(Continued)

(52) U.S. Cl.
CPC ............... *H02N 2/22* (2013.01); *H02N 2/181* (2013.01); *H02N 2/186* (2013.01); *Y10T 29/42* (2015.01);
(Continued)

(58) Field of Classification Search
CPC . H01L 2924/1461; H01L 41/18; H01L 41/25; Y10T 29/49124; Y10T 29/42;
(Continued)

(56) References Cited

U.S. PATENT DOCUMENTS

| 8,274,383 | B2 * | 9/2012 | Mitchell | .................. | G07C 5/08 |
| | | | | | 180/207.1 |
| 2013/0154441 | A1 * | 6/2013 | Redmond | ................ | G08G 1/02 |
| | | | | | 310/319 |

* cited by examiner

*Primary Examiner* — Thiem Phan
(74) *Attorney, Agent, or Firm* — Matthias Scholl, PC; Scholl Matthias

(57) ABSTRACT

A method for manufacturing an energy harvester including a piezoelectric polymer microstructure array. The method includes: preparing a micro-column array of a piezoelectric polymer on a substrate; supplying a plate electrode as an upper electrode, allowing the substrate and the upper electrode to form a pair of plate electrodes; applying a DC voltage between the pair of the plate electrodes; heating the substrate to a temperature higher than a glass transition temperature of the piezoelectric polymer and performing rheological formation of the micro-column array with the DC voltage still being applied until the column array of the piezoelectric polymer reaches the upper electrode to form a mushroom-shaped structure array; and cooling and solidifying the piezoelectric polymer to obtain the piezoelectric energy harvester.

4 Claims, 4 Drawing Sheets

(51) Int. Cl.
*H02N 2/00* (2006.01)
*H02N 2/18* (2006.01)

(52) U.S. Cl.
CPC .... *Y10T 29/49124* (2015.01); *Y10T 29/49153* (2015.01)

(58) Field of Classification Search
CPC .... Y10T 29/49155; H02N 2/22; H02N 2/186; H05K 2201/10083
USPC ........................ 29/25.35, 825, 829, 846, 874
See application file for complete search history.

METHOD FOR MANUFACTURING ENERGY HARVESTER COMPRISING PIEZOELECTRIC POLYMER MICROSTRUCTURE ARRAY

CROSS-REFERENCE TO RELATED APPLICATIONS

This application is a continuation-in-part of International Patent Application No. PCT/CN2014/079030 with an international filing date of May 31, 2014, designating the United States, now pending, and further claims priority benefits to Chinese Patent Application No. 201410027619.1 filed Jan. 21, 2014. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to the field of the micro-nano manufacturing technology, and more particularly to a method for manufacturing an energy harvester comprising a piezoelectric polymer microstructure array.

Description of the Related Art

A typical method for manufacturing an energy harvester based on a piezoelectric polymer includes: preparing an initial film by melt calendaring or extrusion molding at high temperatures, cooling the film to a certain temperature, performing mechanical stretching orientation, vapor plating of an electrode and electric polarizing for obtaining a film having good piezoelectric property, and conducting film fixation and device package. However, such a method has a relatively high production cost, low efficiency, and is not applicable to miniaturization and intelligence of the device. In addition, the high temperature calendaring and extrusion molding and the stretching process are difficult to implement in a silicon planar process in micro-electro-mechanical systems (MEMS).

SUMMARY OF THE INVENTION

In view of the above-described problems, it is one objective of the invention to provide a method for manufacturing an energy harvester comprising a piezoelectric polymer microstructure array. Under actions of both an electric field and a thermal field, a piezoelectric polymer is theologically transformed into a microstructure and is simultaneously polarized along a field direction thereby acquiring a strong piezoelectric property. Thus, a group of a piezoelectric polymer microstructure array connected to an upper electrode and a substrate is obtained and the final piezoelectric energy harvester is directly formed. The method of the invention reasonably integrates piezoelectric property and scale effect of the material. Not only is the piezoelectric microstructure array having a large depth to width ratio realized, but also processes of film preparation, stretching, electric polarization, and device package are simplified. Thus, the manufacturing procedure is shortened, the efficiency is improved, and requirements for batch production, low cost, and consistency are satisfied.

To achieve the above objective, in accordance with one embodiment of the invention, there is provided a method for manufacturing an energy harvester comprising a piezoelectric polymer microstructure array, the method comprising the following steps:

1) fabricating an array of circular holes on a surface of a silicon chip by photolithography and etching processes whereby obtaining an imprint mold, and performing surface treatment on the imprint mold;

2) using a first fluorine-doped tin oxide (FTO) or tin-doped indium oxide (ITO) conductive glass as a substrate; spin coating a layer of a piezoelectric polymer solution having a thickness of a μm scale on a surface of the substrate by a spin coater; and evaporating a solvent residue on a hot plate at a temperature of 100° C.;

3) pressing the imprint mold after treatment on a polymer film with a pressure of 8 megapascal in an oven; raising a temperature in the oven to be higher than a glass transition temperature of the piezoelectric polymer; after between 10 and 30 min, cooling the imprint mold and the polymer film to room temperature; demolding the polymer film from the imprint mold, whereby forming a column array of the piezoelectric polymer on the substrate;

4) using a second FTO or ITO conductive glass as an upper electrode, and allowing the upper electrode and the substrate to form a pair of plate electrodes comprising an air gap therebetween; controlling the air gap between the upper electrode and the substrate to be between 2 and 4 times of a height of the column array by disposing a polyimide film of different thickness therebetween; placing the pair of the plate electrodes into the oven; applying an external DC power supply by connecting a positive electrode thereof to the upper electrode and connecting a negative electrode thereof to the substrate; raising the temperature of the oven to be higher than the glass transition temperature of the piezoelectric polymer; regulating a voltage whereby enabling an electric force applied on the column array of the piezoelectric polymer to counteract a surface tension and a viscous resistance rheology; and maintaining the voltage for between 20 and 50 min until the column array of the piezoelectric polymer reaching the upper electrode and forming a mushroom-shaped structure array; and 5) maintaining the voltage constantly, cooling the oven to room temperature and removing the voltage whereby obtaining a group of microstructure array of the piezoelectric polymer connected to the substrate and the upper electrode; removing the polyimide film from between the substrate and the upper electrode whereby obtaining a piezoelectric energy harvester formed by the microstructure array of the piezoelectric polymer, the substrate, and the upper electrode.

In a class of this embodiment, the piezoelectric polymer is a polyvinylidene fluoride (PVDF), a polyvinylidene fluoride-trifluoroethylene copolymer (P(VDF-TrFE)), a polyvinyl chloride (PVC), or a poly-ω-aminoundecanoyl.

In a class of this embodiment, the piezoelectric polymer solution is prepared by dispersing an piezoelectric polymer powder in a corresponding solvent to obtain mixture in which the piezoelectric polymer powder accounts for 10 wt. % of a total weight, and stirring the mixture in water bath at a temperature of 60° C. by a magnetic stirrer for between 30 and 50 min.

The invention also provides a method for transforming mechanical vibration into electric energy using the piezoelectric energy harvester obtained according to the method, the method comprising connecting the piezoelectric energy harvester to an external circuit; converting an AC current produced by a periphery mechanical vibration into a DC current by a rectifier, obtaining a DC voltage by filtering and DC conversion.

Advantages according to embodiments of the invention are summarized as follows: the method of the invention is applicable for a wide range of the piezoelectric polymer material, and the obtained piezoelectric energy harvester comprises the microstructure array having a large depth to width ratio, thereby greatly improving the energy conversion efficiency of the piezoelectric energy harvester. In addition, the method involves no complex processes, and the microstructure and electric polarization can be accomplished simultaneously. The manufacturing process of the device is one step formation, which largely decreases the processing cost and improves the processing efficiency. The device of the invention is adapted to broad application in fields of underwater acoustic detection, piezoelectric sensing, and ultrasonic transduction, and to realize wireless energy supply to low energy consumed products, such as wireless networks, embedded systems, and MEMS, thereby presenting good application prospects of the piezoelectric energy harvesting technology.

BRIEF DESCRIPTION OF THE DRAWINGS

The in invention is described hereinbelow with reference to the accompanying drawings, in which.

DETAILED DESCRIPTION OF THE EMBODIMENTS

For further illustrating the invention, experiments detailing a method for manufacturing an energy harvester comprising a microstructure array of a piezoelectric polymer are described below. It should be noted that the following examples are intended to describe and not to limit the invention.

Figure 1:
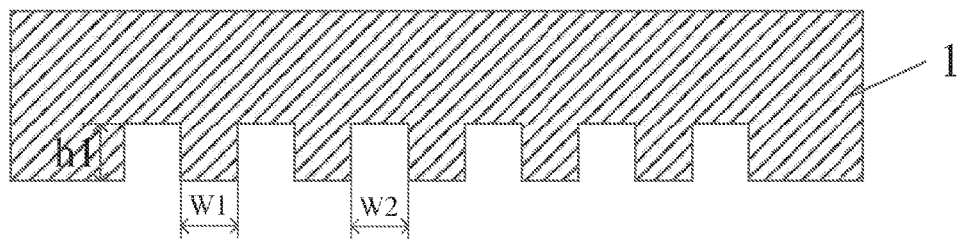
FIG. 1 is a structure diagram of an imprint mold according to one embodiment of the invention.

A method for manufacturing an energy harvester comprising a microstructure array of a piezoelectric polymer is conducted as follows:

First, preparation and treatment of an imprint mold. As shown in FIG. 1, a micro-hole array is fabricated on a silicon chip by conventional photolithography and etching processes thereby obtaining an imprint mold 1. The imprint mold 1 is immersed in a fluorosilanes solution for 6 hrs and is then baked for 12 hrs for decreasing a surface energy, so that a micro-column array structure of the imprint mold is prevented from damage in demolding process.

Figure 2:
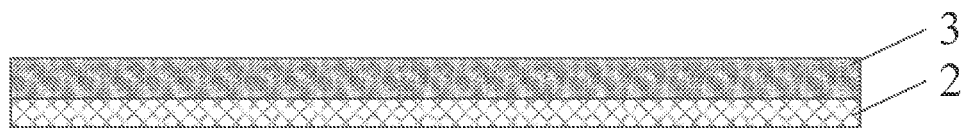
FIG. 2 is a structure diagram showing preparation of a layer of piezoelectric polymer film on a substrate according to one embodiment of the invention.

Second, selection and treatment of a substrate and an upper electrode. A first fluorine-doped tin oxide (FTO) or tin-doped indium oxide (ITO) conductive glass and a second FTO or ITO conductive glass are utilized as the substrate 2 and the upper electrode 6, respectively. A layer of a piezoelectric polymer 3 solution having nano-scale thickness is spin coated on a surface of the substrate 2 by a spin coater. A solvent residue is evaporated on a hot plate at a temperature of 100° C., as shown in FIG. 2.

Figure 3:
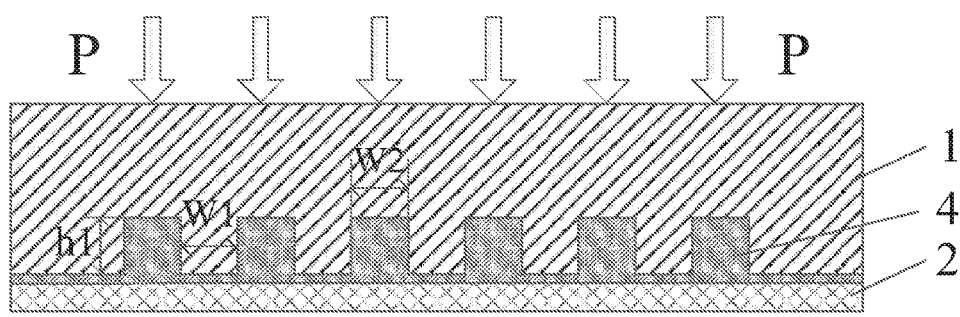
FIG. 3 is a structure diagram showing a treated imprint mold pressing on a piezoelectric polymer film according to one embodiment of the invention.
Figure 4:
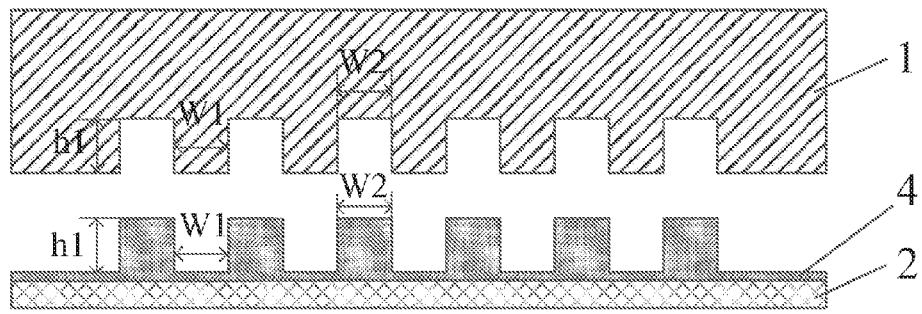
FIG. 4 is a structure diagram of a piezoelectric polymer column array formed after demolding according to one embodiment of the invention.

Third, imprinting and demolding. The imprint mold 1 after treatment is pressed on the piezoelectric polymer 3 with a pressure of 8 megapascal in an oven. A temperature in the oven is increased to higher than a glass transition temperature of the piezoelectric polymer. After between 10 and 30 min, the temperature is cooled to room temperature. The piezoelectric polymer 3 is demolded from the imprint mold 1, and a column array 4 of the piezoelectric polymer is formed on the substrate, as shown in FIGS. 3-4.

Figure 5:
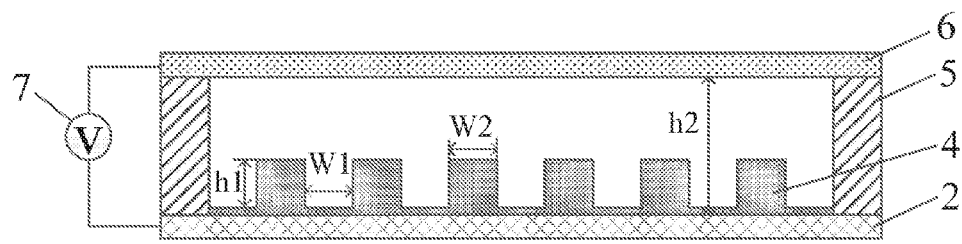
FIG. 5 is a structure diagram showing a substrate and an upper electrode separated by a bracket and applied with an external electric field according to one embodiment of the invention.
Figure 6:
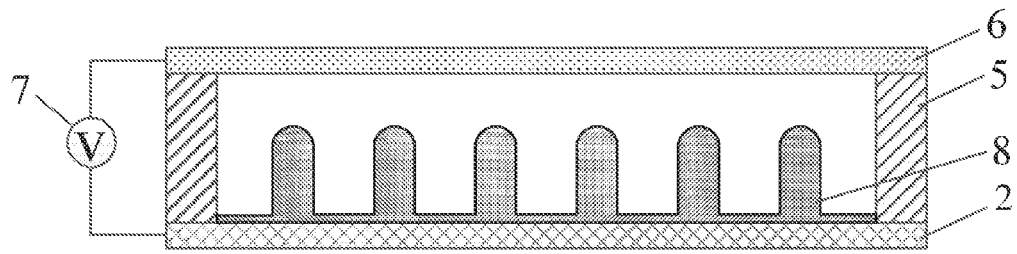
FIG. 6 is a structure diagram showing rheological formation of a piezoelectric polymer microstructure array in the presence of an electric field under a heating condition according to one embodiment of the invention.
Figure 7:
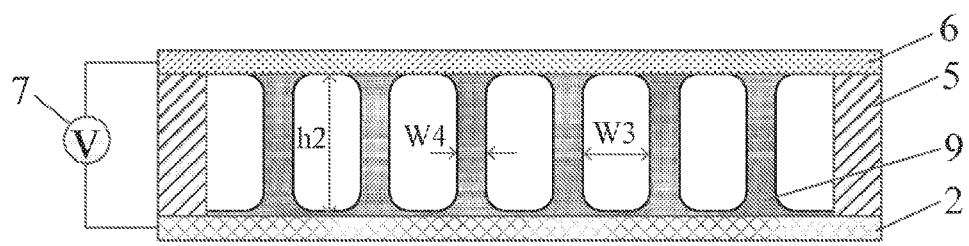
FIG. 7 is a structure diagram showing a piezoelectric polymer microstructure array connected to an upper electrode and a substrate after electric field-induced theological forming process according to one embodiment of the invention.

Fourth, electric field-induced rheological forming. The upper electrode 6 and the substrate 2 both made of the FTO or ITO conductive glass form a pair of plate electrodes. An air gap exists between the two plate electrodes. The air gap is controlled by disposing a polyimide film 5 of different, thickness between the two plate electrodes and is required to be between 2 and 4 times of a height of the column array. The pair of plate electrodes is disposed into the oven, and an external DC power supply 7 is applied, a positive electrode of the external DC power supply 7 is connected to the upper electrode 6 and a negative electrode thereof is connected to the substrate 2. The temperature of the over is then increased to higher than the glass transition temperature of the piezoelectric polymer. Thereafter, a voltage is regulated to enable a piezoelectric polymer micro-column array 8 to counteract a surface tension and a viscous resistance rheology under the action of the electric force. The applied voltage is maintained for between 20 and 50 min until the piezoelectric polymer micro-column array 8 reaches the upper electrode 6 and forms a mushroom-shaped structure array 9 having a large top, as shown in FIGS. 5-7.

Figure 8:
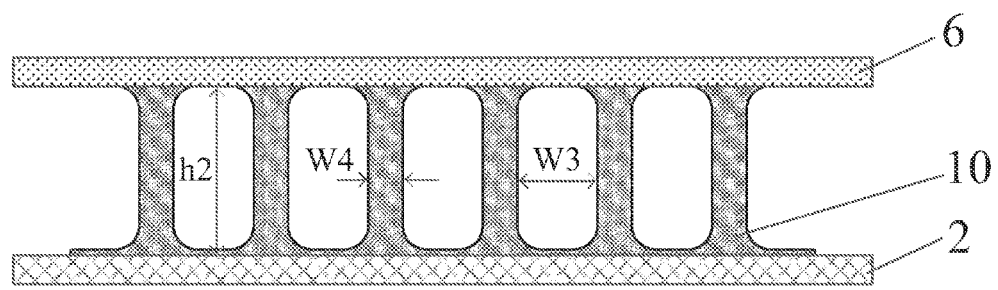
FIG. 8 is a structure showing a piezoelectric energy harvester after cooling and solidification and separation from polyimide films according to one embodiment of the invention.

Fifth, solidification of the piezoelectric polymer for directly obtaining a piezoelectric sensor. In the presence of a constant voltage of the external DC power supply 7, the temperature of the oven is cooled to room temperature. Thereafter, the external DC power supply 7 is removed, and a group of a piezoelectric polymer microstructure array 10 connected to the substrate 2 and the upper electrode 6 is obtained. The polyimide film 5 is pulled out from between the substrate 2 and the upper electrode 6, so that a miniature piezoelectric energy harvester is formed by the piezoelectric polymer microstructure array 10 having a large depth to width ratio, the upper electrode, and the substrate 2, as shown in FIG. 8.

Figure 9:
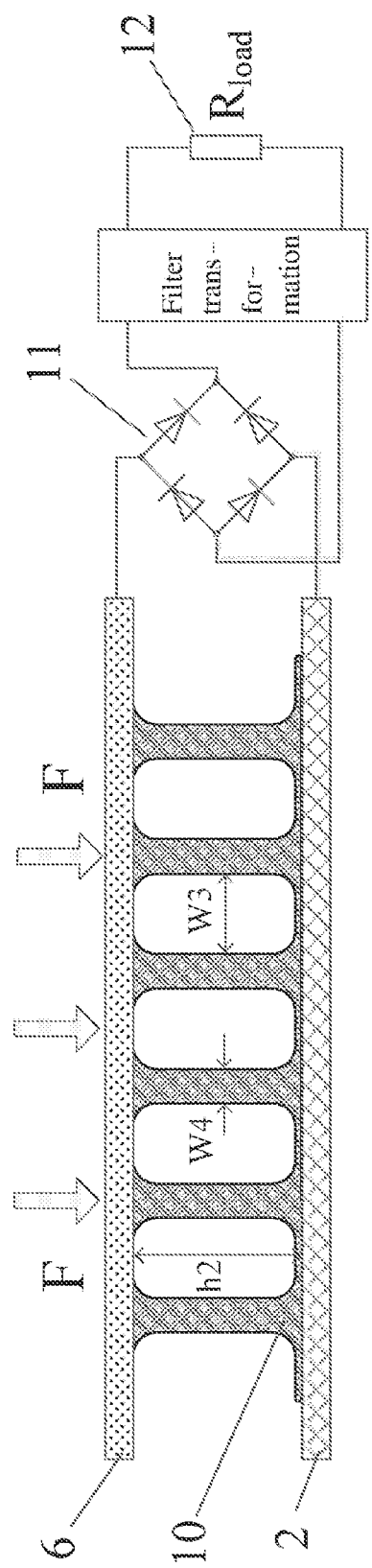
FIG. 9 is a structure diagram showing conversion of mechanical vibration into an electric energy by adopting a piezoelectric energy harvester according to one embodiment of the invention.

Sixth, conversion of a periphery vibration into an electric energy by the piezoelectric energy harvester. The piezoelectric energy harvester harvester is connected to an external circuit. An AC current produced by the periphery mechanical vibration F is converted into a DC current generally via a rectifier 11, and a required DC voltage is obtained after filtering and DC conversion and is then supplied to a load resistance 12, as shown in FIG. 9.

In the above method, when the piezoelectric polymer is a polyvinylidene fluoride (PVDF), dimensional parameters are as follows: both a size W1 of a convex part and a size W2 of a concave part of the imprint mold are between 10 and 100 µm; a distance h2 between the two plate electrodes is between 20 and 100 µm; an imprint height h1 is between 10 and 50 µm; a size W4 of the final piezoelectric polymer microstructure array is between 5 and 50 µm; a gap W3 between micro-columns is between 10 and 100 µm, and a height h2 of the final piezoelectric polymer microstructure array is between 20 and 100 µm.

The method of the invention adopts the imprint photolithography and the electric field-induced theological formation to acquire a micro-column array having a strong piezoelectric effect and a large depth to width ratio. The method is adapted to conduct large area positioning by imprint photolithography, and the positioning is accurate, simple, and economic. The micro-column array obtained from the imprint is further conducted with rheological formation under both actions of the thermal field and the electric field and finally contacts with the upper plate electrode, so that a microstructure array connected to the upper electrode and the lower electrode (the substrate) is formed. The microstructure array connected to the upper electrode and the lower electrode is cooled and solidified, and the required piezoelectric energy harvester is directly obtained. Such process procedure does not require any multiple and complicate processes, and the microstructure and electric polarization are accomplished simultaneously. The one-step formation of the device largely decreases the processing cost, and improves the processing efficiency. Furthermore, the device of the invention can be widely applied in fields of underwater acoustic detection, piezoelectric sensing, and ultrasonic transduction.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing an energy harvester comprising a piezoelectric polymer microstructure array, the method comprising:
   1) fabricating an array of circular holes on a surface of a silicon chip by photolithography and etching processes whereby obtaining an imprint mold, and performing surface treatment on the imprint mold;
   2) using a first fluorine-doped tin oxide (FTO) or tin-doped indium oxide (ITO) conductive glass as a substrate; spin coating a layer of a piezoelectric polymer solution having a thickness of um scale on a surface of the substrate by a spin coater; and evaporating a solvent residue on a hot plate at 100° C.;
   3) pressing the imprint mold after treatment on a polymer film with a pressure of 8 megapascal in an oven; raising a temperature in the oven to be higher than a glass transition temperature of the piezoelectric polymer; after between 10 and 30 min, cooling the imprint mold and the polymer film to room temperature; demolding the polymer film from the imprint mold, whereby forming a column array of the piezoelectric polymer on the substrate;
   4) using a second FTO or ITO conductive glass as an upper electrode, and allowing the upper electrode and the substrate to form a pair of plate electrodes comprising an air gap therebetween; controlling the air gap between the upper electrode and the substrate to be between 2 and 4 times of a height of the column array by disposing a polyimide film therebetween; placing the pair of the plate electrodes into the oven; applying an external DC power supply by connecting a positive electrode thereof to the upper electrode and connecting a negative electrode thereof to the substrate; raising the temperature of the oven to be higher than the glass transition temperature of the piezoelectric polymer; regulating a voltage whereby enabling an electric force applied on the column array of the piezoelectric polymer o counteract a surface tension and a viscous resistance rheology; and maintaining the voltage for between 20 and 50 min until the column array of the piezoelectric polymer reaches the upper electrode to form a mushroom-shaped structure array; and
   5) maintaining the voltage constantly, cooling the oven to room temperature and removing the voltage whereby obtaining a group of microstructure array of the piezoelectric polymer connected to the substrate and the upper electrode; removing the polyimide film from between the substrate and the upper electrode, whereby obtaining a piezoelectric energy harvester formed by the microstructure array of the piezoelectric polymer, the substrate, and the upper electrode.

2. The method of claim 1, wherein the piezoelectric polymer is a polyvinylidene fluoride (PVDF), a polyvinylidene fluoride-trifluoroethylene copolymer (P(VDE-TrFE)), a polyvinyl chloride (PVC), or a poly-ω-aminoundecanoyl.

3. The method of claim 1, wherein the piezoelectric polymer solution is prepared by dispersing an piezoelectric polymer powder in a corresponding solvent to obtain a mixture in which the piezoelectric polymer powder accounts for 10 wt. % of a total weight, and stirring the mixture in water bath at a temperature of 60° C. by a magnetic stirrer for between 30 and 50 min.

4. A method for transforming mechanical vibration into electric energy using a piezoelectric energy harvester obtained according to the method of claim 1, the method comprising connecting the piezoelectric energy harvester to an external circuit; converting an AC current produced by a periphery mechanical vibration into a DC current by a rectifier, obtaining a DC voltage by filtering and DC conversion.

* * * * *